(12) United States Patent
Rosenberger et al.

(10) Patent No.: US 10,158,347 B2
(45) Date of Patent: Dec. 18, 2018

(54) DEVICE AND METHOD FOR PROVIDING A SIGNAL HAVING AN ADJUSTABLE PULSE DUTY FACTOR

(71) Applicant: Robert Bosch GmbH, Stuttgart (DE)

(72) Inventors: Marcus Rosenberger, Schwieberdingen (DE); Rene Schenk, Tamm (DE); Thomas Daub, Vaihingen/Enz (DE)

(73) Assignee: Robert Bosch GmbH, Stuttgart (DE)

( * ) Notice: Subject to any disclaimer, the term of this patent is extended or adjusted under 35 U.S.C. 154(b) by 4 days.

(21) Appl. No.: 15/509,362

(22) PCT Filed: Aug. 5, 2015

(86) PCT No.: PCT/EP2015/068008
§ 371 (c)(1),
(2) Date: Mar. 7, 2017

(87) PCT Pub. No.: WO2016/037770
PCT Pub. Date: Mar. 17, 2016

(65) Prior Publication Data
US 2017/0257081 A1  Sep. 7, 2017

(30) Foreign Application Priority Data

Sep. 9, 2014  (DE) .................. 10 2014 218 010

(51) Int. Cl.
*H03K 5/04* (2006.01)
*H03K 3/017* (2006.01)
(Continued)

(52) U.S. Cl.
CPC ............... *H03K 3/017* (2013.01); *H03K 7/08* (2013.01); *H03K 21/38* (2013.01)

(58) Field of Classification Search
None
See application file for complete search history.

(56) References Cited

U.S. PATENT DOCUMENTS 4,045,685 A * 8/1977 Gehrig ................. H03K 5/1515
327/171
6,765,422 B1   7/2004 Aslan et al.
(Continued)

FOREIGN PATENT DOCUMENTS

EP   0868028   9/1998
EP   1653618   5/2006

OTHER PUBLICATIONS

International Search Report for Application No. PCT/EP2015/068008 dated Nov. 5, 2015 (English Translation, 2 pages).

*Primary Examiner* — Lincoln Donovan
*Assistant Examiner* — Khareem E Almo
(74) *Attorney, Agent, or Firm* — Michael Best & Friedrich LLP

(57) ABSTRACT

The invention relates to a device and to a method for producing a signal having an adjustable pulse duty factor, in particular a pulse-width-modulated signal. For this purpose, the period duration of the pulse-width-modulated signal can be varied. Thus, the pulse duty factor of the pulse-width-modulated signal can be adapted very accurately to the desired pulse duty factor without great switching complexity by using a simple counter with a fixed clock frequency.

10 Claims, 4 Drawing Sheets

(51) Int. Cl.
*H03K 7/08* (2006.01)
*H03K 21/38* (2006.01)

(56) References Cited

U.S. PATENT DOCUMENTS

| | | | | |
|---|---|---|---|---|
| 2002/0021155 A1* | 2/2002 | Heyne | ................. | H03K 5/1252 |
| | | | | 327/175 |
| 2005/0099217 A1 | 5/2005 | Agarwal | | |
| 2011/0169541 A1* | 7/2011 | Steinmann | ............... | H03K 7/08 |
| | | | | 327/172 |
| 2011/0279076 A1* | 11/2011 | Hirt | .......................... | H02P 7/28 |
| | | | | 318/503 |
| 2013/0049819 A1* | 2/2013 | Hartmann | .............. | H01H 47/32 |
| | | | | 327/110 |
| 2017/0357556 A1* | 12/2017 | Bisig | ................... | G06F 11/1604 |

* cited by examiner

DEVICE AND METHOD FOR PROVIDING A SIGNAL HAVING AN ADJUSTABLE PULSE DUTY FACTOR

BACKGROUND OF THE INVENTION

The present invention relates to a device and to a method for generating a signal having an adjustable pulse duty factor, and to a pulse-width-modulation device and a voltage converter.

Pulse-width modulation (PWM) is a highly widespread technique. It is used in many areas of application, for example in the area of controlling power electronics or for current or voltage conversion. There are numerous other areas of application as well.

A PWM signal is normally a square wave signal having a constant period. During this period, the signal can assume a first state within a first time interval and can assume a second state in the time remaining in the period. The ratio of the time intervals in which the signal assumes the first and the second state is referred to as the pulse duty factor.

In order to digitally generate PWM signals, a counter can be used, for example, which periodically counts from zero up to a predetermined maximum value at a predefined clock frequency. Once the maximum value has been reached, the counter is reset and restarts at zero. Therefore, the clock frequency, in combination with the maximum value of the counter, determines the period of the PWM signal to be generated. The resolution of the pulse duty factor, which can be adjusted in this way, is determined via the clock frequency of the counter.

European patent application EP 1 653 618 A2 discloses a PWM generator having an increased resolution of the pulse duty factor. An additional generator is proposed for this purpose, which is clocked with a period which corresponds to a small fraction of the maximum PWM period.

Therefore, there is a need for a simple and efficient generation of signals having a precisely adjustable pulse duty factor.

SUMMARY OF THE INVENTION

For this purpose, the present invention provides, according to a first aspect, a device for generating signals having an adjustable pulse duty factor. The device comprises a counter which is designed for counting from a predefined start value up to a maximum count value at a predetermined clock rate; an output device which is designed for outputting a first signal value when the value of the counter is less than or equal to a switching value and outputting a second signal value when the value of the counter is greater than the switching value. The device further comprises a control device which is designed for determining a preliminary switching value for a setpoint value of a pulse duty factor to be adjusted, on the basis of a predetermined base value for the maximum count value, calculating a preliminary pulse duty factor which results from the preliminary switching value and the base value for the maximum count value, ascertaining a deviation of the calculated, preliminary pulse duty factor from the setpoint value for the pulse duty factor to be adjusted, and increasing or decreasing the predetermined base value for the maximum count value by using the ascertained deviation, in order to obtain the maximum count value.

According to a further aspect, the present invention provides a method for generating a signal having an adjustable pulse duty factor. The method includes the steps of receiving a setpoint value for a pulse duty factor to be adjusted, determining a preliminary switching value for the received setpoint value of the pulse duty factor to be adjusted, on the basis of a predetermined base value for the maximum count value; calculating a preliminary pulse duty factor which results from the preliminary switching value and the predetermined base value for the maximum count value; ascertaining a deviation of the calculated preliminary pulse duty factor from the received setpoint value for the pulse duty factor to be adjusted; determining a maximum count value by increasing or decreasing the predetermined base value for the maximum count value by using the ascertained deviation, starting a counter with a predefined start value and incrementing the counter at a predetermined clock rate; outputting a first signal value when the value of the counter is less than or equal to the switching value; and outputting a second signal value when the value of the counter is greater than the switching value.

According to a further aspect, the present invention provides a pulse-width-modulation device comprising a device according to the invention for generating signals having an adjustable pulse duty factor.

According to a further aspect, the present invention provides a voltage converter comprising a pulse-width-modulation device according to the invention.

The present invention is based on the finding that, when PWM signals are generated by means of a counter, the resolution of the pulse duty factor of the PWM signals is limited by the clock rate and the maximum count value of the counter. Therefore, the present invention is based on the idea of varying the period of the pulse duty factor to be adjusted by adapting the maximum count value when generating a PWM signal. The clock frequency of the counter can be held constant in this case.

Due to the variation of the maximum value up to which the counter counts in each case, the period of the output signal also changes, while the clock rate remains constant. Depending on this maximum count value for the counter, different adjustable pulse duty factors therefore result for each count value. Due to the selection of a suitable maximum count value, a switching value, at which the PWM signal switches from one signal state to the other signal state which conforms very well with the actually desired pulse duty factor, can be determined in this way for the desired pulse duty factor. Therefore, the PWM signal can also be adjusted very accurately given a relatively slowly clocked counter without the need for further complex switching measures for adapting the pulse duty factor.

According to one embodiment, the control device adapts the switching value by using the preliminary switching value and the ascertained deviation of the calculated, preliminary pulse duty factor from the setpoint value for the pulse duty factor to be adjusted.

According to one further embodiment, the control device comprises a memory. This memory is designed for providing parameters for increasing or decreasing the base value for the maximum count value and/or for adapting the switching value. For example, the parameters provided in the memory can be provided in the form of a table (lookup table, LUT). The parameters provided can be, for example, count values for the maximum count value or the switching value, each of which can be used for a pulse duty factor to be adjusted. Alternatively, the parameters provided can also be correction values which can be used for adapting a predefined basic setting for the maximum count value and/or the switching value depending on the pulse duty factor to be adjusted. By using parameters that have already been stored in a memory, the adaptation of the parameters to the pulse duty factor to be adjusted can take place particularly rapidly and without complex computing steps.

According to a further embodiment, the control device comprises a computing device which is designed for calculating a value for increasing or decreasing the base value for the maximum count value and/or adapting the switching value. If sufficient resources are available for calculating the maximum count value or the switching value, the adaptation of these values can be ascertained by means of a suitable computing method. This allows for a particularly flexible adaptation of the values to be adjusted.

According to one embodiment, the method for generating a signal further includes a step for resetting the counter to the predefined start value when the value of the counter has exceeded the maximum value. In this way, a periodic PWM signal can be output.

According to one further embodiment, the step for determining the maximum count value establishes the count value within a predetermined value range.

According to one further embodiment, the step for determining the maximum count value determines a value for increasing or decreasing the base value by using a predetermined formula.

Further embodiments and advantages of the present invention result from the following description with reference to the attached drawings.

DETAILED DESCRIPTION

Figure 1:
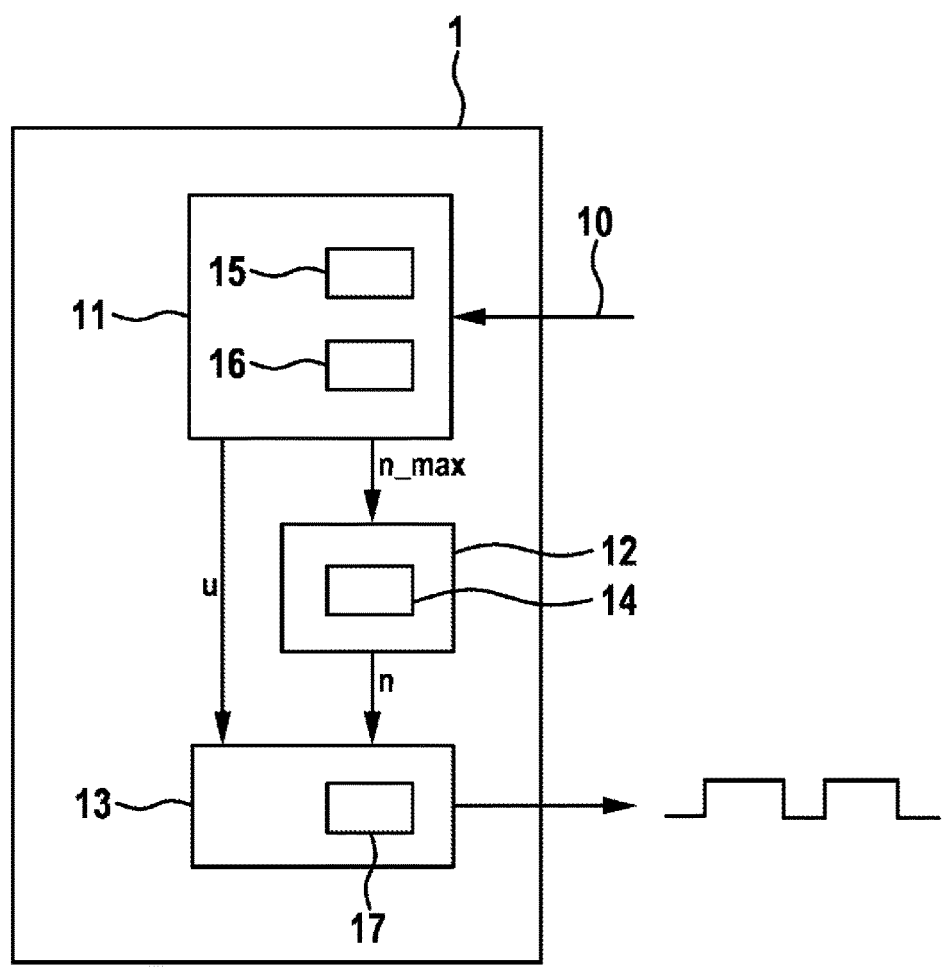
FIG. 1 shows a schematic representation of a device for generating signals according to one embodiment.

FIG. 1 shows a schematic representation of a device 1 for generating signals having an adjustable pulse duty factor. The device 1 comprises a control device 11, a counter 12, and an output device 13. A setpoint value 10 of a pulse duty factor to be adjusted can be provided at the control device 11. The setpoint value 10 can be provided at the control device 11 either as an analog signal or as a digital signal. For example, the control device 11 can be coupled to a communication bus, via which the setpoint value 10, as a digital setpoint, is transmitted to the control device 11.

On the basis of the predefined setpoint value 10 for the pulse duty factor, which the control device 11 has received, the control device 11 then determines a suitable maximum count value n_max and a switching value u. The maximum count value n_max can be determined in such a way, in particular, that, when incrementing in whole numbers up to the maximum count value n_max, an increment results which, when the switching value u is reached, results in a pulse duty factor which conforms as precisely as possible to the pulse duty factor to be adjusted. The determination of the maximum count value n_max and the switching value u carried out by using the received setpoint value are explained in greater detail further below.

The counter 12 is designed for periodically counting, in whole numbers, from a predefined start value up to the maximum count value n_max determined by means of the control device 11. As a rule, the predefined start value will be zero. The counter 12 comprises a clock generator 14. This clock generator 14 provides a periodic signal for the counter 12. On the basis of this periodic signal of the counter 14, the counter 12 continuously increases its count value n in whole numbers until it reaches the maximum count value n_max predefined by the control device 11. The counter 12 is then reset to the start value and begins to increment again. In principle, it is also possible, alternatively, to decrement from the maximum value n_max down to the start value and to then reset the counter 12 to the maximum count value n_max. Preferably, the frequency of the signal from the clock generator 14 is constant, i.e., the frequency of the signal from the clock generator 14 is independent, in particular, of the pulse duty factor to be adjusted.

The switching value determined by the control device 11, and the current value of the counter 12 are provided to the output device 13. This output device 13 comprises a comparator device 17 which compares the current value n of the counter with the switching value u determined by means of the control device 11. Provided the value n of the counter 12 is less than or equal to the switching value u, the output device 11 outputs a first signal value. For example, this first signal value can be a logical "1" (logical high). However, if the value n of the counter 12 exceeds the switching value u predefined by the control device 11, the output device 13 outputs a second signal value, for example, a logical "0" (logical low). Alternatively, a logical high can also be output, of course, provided the value n of the counter 12 is less than the predefined switching value u, and a logical low can be output when the value n of the counter 12 has exceeded the switching value u.

Figure 2:
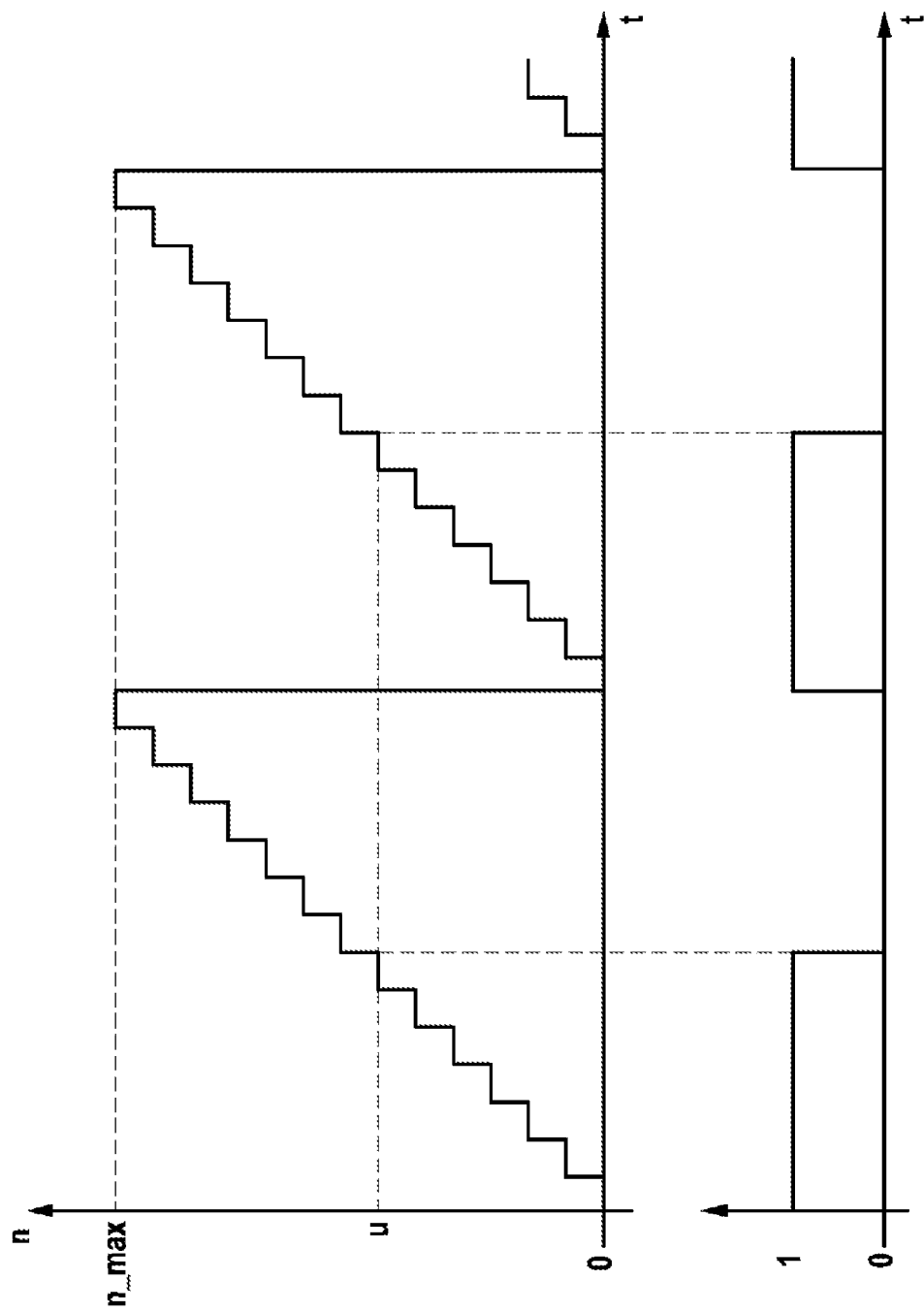
FIG. 2 shows a schematic representation of the progression of the count values and an output signal as a function of time, which forms the basis for one embodiment.

FIG. 2 shows a schematic representation of the progression of the count values n of the counter 12 and the signal output by the output device 13. In the upper diagram, the value n of the counter 12 is depicted as a function of time t. The value of the counter 12 is increased in this case from a start value, which is 0 in this case, up to a maximum count value n_max. If the maximum count value n_max is reached, the counter 12 is reset to the start value and begins to increment again.

The signal value output by the output device 13 is depicted under this representation. A first signal value, which is "1" in this case, is output by the output device 13 between the start value and the switching value u. However, an alternative signal value, which is "0" in this case, is output between the switching value u and the maximum count value n_max.

If the same, predetermined base value is always used for the maximum count value n_max, and given a constant, likewise fixedly predetermined clock rate for the counter 12, a fixed increment results for the resolution, with which the pulse duty factor can be adjusted. Depending on the desired pulse duty factor, this fixed increment results in deviations between the actually resulting pulse duty factor and the desired pulse duty factor.

If the counter 12 counts in ten steps, for example, the pulse duty factor can be adjusted with a resolution in steps of 0.1. However, if the desired pulse duty factor is, for example, 0.55, a deviation of 50% of one increment results between the achievable actual pulse duty factor of 0.5 and the desired pulse duty factor of 0.55.

This deviation can be minimized by varying the number of steps, i.e., by adapting the maximum count value n_max.

If the base value for the maximum count value is increased by one, for example, the counter 12 then counts in eleven steps. In addition, if the switching value u is also increased by one, the actual pulse duty factor that results is 6:11=0.545%. This new pulse duty factor is situated substantially closer to the desired pulse duty factor.

As this example shows, by varying, in particular increasing or decreasing the maximum count value n_max, the actually achievable pulse duty factor can be better adapted to the desired pulse duty factor than would be the case with a counter 12 which always uses an identical, fixedly predetermined maximum count value. Due to the constant clock rate of the counter 12, the variation of the maximum count value n_max is also accompanied by a variation of the period of the output, pulse-width-modulated signal.

Correspondingly, the accuracy of the PWM signal, which is generated by the device 1 from FIG. 1, can be increased by varying the period. After the control device 11 has received a setpoint value 10 for a pulse duty factor to be adjusted, the control device 11 initially determines a preliminary switching value. This preliminary switching value corresponds to the switching value which would result if the counter were operated using a predetermined base value for the maximum count value. Such a predetermined base value for the maximum count value can be permanently stored, for example, in the control device 11. The control device 11 can then calculate a preliminary pulse duty factor which would result if PWM signals were generated by using the previously determined, preliminary switching value and the fixedly predefined base value for the maximum count value. On the basis of the thus calculated, preliminary pulse duty factor, a deviation between the preliminary pulse duty factor and the desired setpoint value 10 for the pulse duty factor to be adjusted can then be ascertained.

On the basis of these ascertained parameters, in particular the preliminary switching value, the deviation between the preliminary pulse duty factor and the setpoint value 10, and the base value for the maximum count value, it is possible to adapt the maximum count value n_max and, if necessary, the switching value u in order to increase the accuracy of the PWM signal to output.

For this purpose, the control device 11 can comprise a memory 16, for example, in which suitable correction values for increasing or decreasing the base value for the maximum count value and/or the preliminary switching value are stored. For example, these parameters can be stored in a table which has a column for every possible preliminary switching value and has a row for each of a multiplicity of possible deviations between the preliminary pulse duty factor and the setpoint value for the pulse duty factor. The parameters for adapting the maximum count value and/or the preliminary switching value can then be stored in the corresponding cells of the table.

Alternatively, an individual calculation of the correction values for increasing or decreasing the base value for the maximum count value and/or the preliminary switching value is also possible. One possible approach for calculating the adaptation of the maximum count value or the switching value is described in the following.

The symbols used therein mean:
D: preliminary pulse duty factor between 0 and 1 (corresponding to 0% . . . 100%);
R: relative deviation between the preliminary pulse duty factor and the setpoint value relative to the increment (value range between 0 . . . 1, corresponding to 0% . . . 100%);
KP: correction value for the maximum count value;
KD: correction value for the switching value; and
[x]: rounding the value x up to a whole number.

Initially it is determined whether the pulse duty factor to be adjusted is greater or less than 0.5 (50%). For the case in which the pulse duty factor is exactly 0.5, both alternatives can be used.

If the pulse duty factor is less than (or equal to) 0.5, the following rule for computing can be applied:

The correction value KD for the switching value u is always 0 (KD=0), i.e., the switching value u always corresponds to the preliminary switching value.

The correction value KP for the maximum count value is determined as follows:

$$KP = -[R/D].$$

Therefore, the rounded quotient of the deviation R between the preliminary pulse duty factor and the setpoint value for the pulse duty factor, and the preliminary pulse duty factor D is subtracted from the base value for the maximum count value.

For example, if the objective is to adjust a pulse duty factor of 0.45 (45%) given a base value of 10 for the maximum count value, the following calculation results:

Given a base value of 10, the pulse duty factor can be adjusted in steps of 0.1. Therefore, a preliminary switching value of 4 and a preliminary pulse duty factor of 0.4 result. The relative deviation between the preliminary pulse duty factor and the setpoint value for the pulse duty factor is 50% (0.5) of one step of 0.1.

The correction value for the maximum count value is therefore determined as follows:

$$KP = -[0.5/0.4] = -[1.25] = -1.$$

The base value of 10 is therefore decreased by 1, and so a maximum count value n_max of 9 results. Since the switching value of 4 remains unchanged, the pulse duty factor that results after the correction is therefore 4:9≈0.44 (44%) which is substantially closer to the setpoint value.

If the pulse duty factor is greater than (or equal to) 0.5, both the preliminary switching value and the maximum count value are adapted. In this case, the same correction values are added to the preliminary switching value and to the base value for the maximum count value:

$$KD = KP = [R/[(1-D)]]$$

Therefore, the rounded quotient of the deviation R between the preliminary pulse duty factor and the setpoint value, divided by 1 minus the preliminary period D, is added to both the preliminary switching value and to the base value for the maximum count value.

For example, if the objective is to adjust a pulse duty factor of 0.68 (68%) given a base value of 10 for the maximum count value, a value of 6 initially results for the preliminary switching value. The deviation between the preliminary pulse duty factor and the desired setpoint value is 0.8 (80%) in this case. The correction values are therefore calculated as follows $$KD = KP = [0.8/(1-0.6)] = [0.8/0.4] = 2.$$

The maximum count value n_max is therefore 10+2=12, and the switching value u is 6+2=8. This results in an actual pulse duty factor of 8:12≈0.67 (67%).

With regard to the determination of the maximum count value n_max by the control device 11, the maximum count value n_max can be determined, preferably, within a predetermined value range. On the basis of this predetermined value range for the maximum count value n_max, and in accordance with the clock rate of the clock generator 14 in the counter 12, a corresponding range for the period of the signal output by the output device 13 also results. Small maximum count values result in a short period, whereas large maximum count values result in a longer period. Due to the limitation of the maximum count value n_max to a predetermined value range, the period of the output signal can also be limited to a predetermined range.

Figure 3:
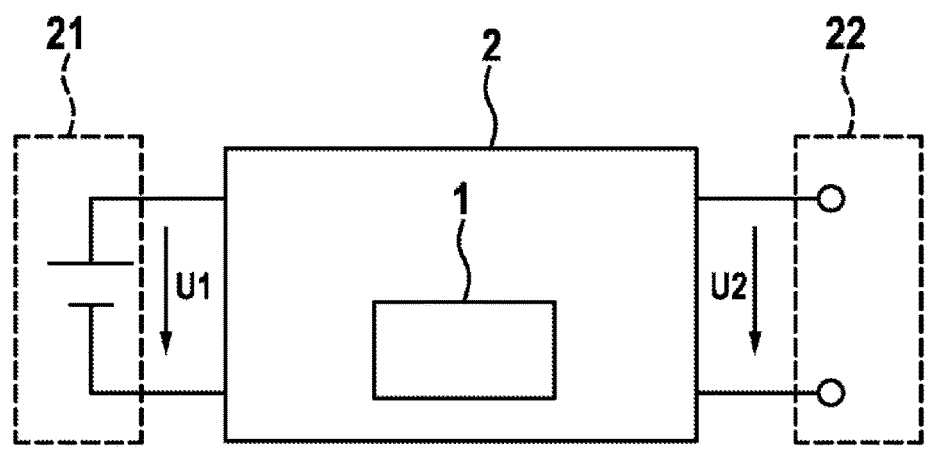
FIG. 3 shows a schematic representation of a voltage converter according to one embodiment.

FIG. 3 shows a schematic representation of a voltage converter 2 for converting a voltage U1 provided by a voltage source 21 into a further voltage U2. For example, a first DC voltage can be provided, as the input voltage U1, at the voltage converter 2, which DC voltage is converted via a DC-to-DC converter into a DC voltage U2 at a different voltage level. In order to actuate the voltage converter 2, a PWM signal, which is generated by a device 1 for generating signals having adjustable pulse duty factors, is provided in the voltage converter 2. For example, the signal can be generated by a pulse-width-modulation device comprising a device 1 for generating signals having adjustable pulse duty factors. The voltage U2 provided at the output terminal 22 can be adapted or adjusted in this case depending on the adjusted pulse duty factor of the PWM signal.

In addition, the device 1 for generating a signal having an adjustable pulse duty factor can also be used for any other further applications in which a pulse-width-modulated signal having an adjustable pulse duty factor is required. A PWM signal of this type can be used in any application in which the period of the PWM signal can be varied within acceptable tolerances. In particular, a PWM signal generated in this way can be used for power-electronic applications, such as, for example, electrical drive systems, voltage converters, or the like.

Figure 4:
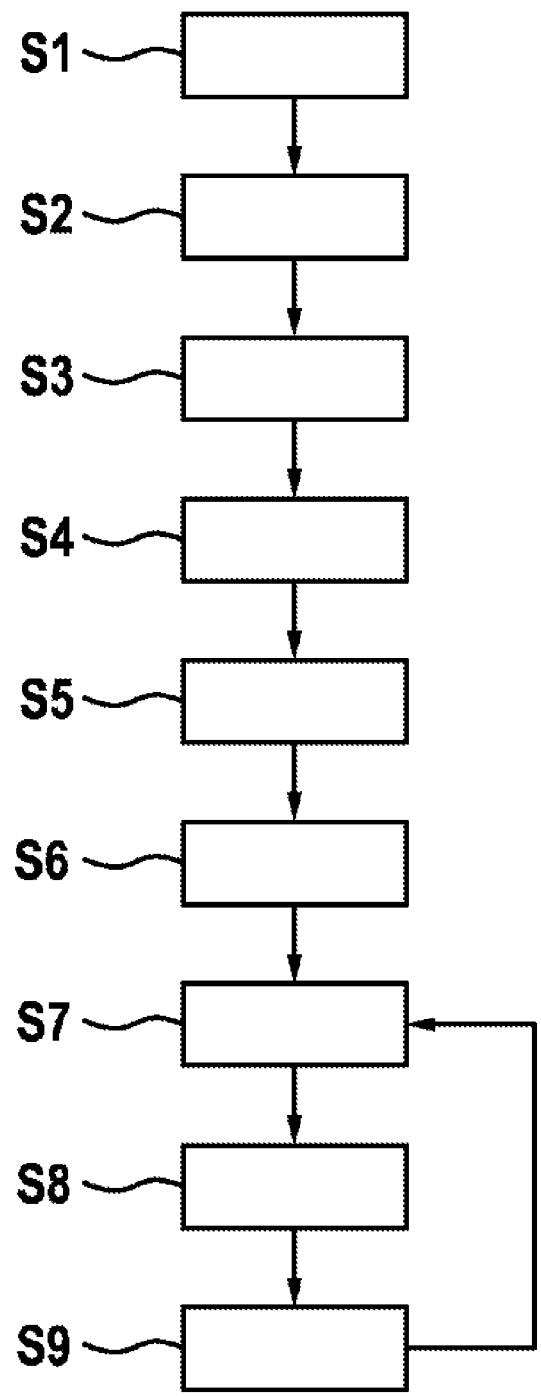
FIG. 4 shows a schematic representation of a flow chart which forms the basis for a method for generating signals according to one embodiment.

FIG. 4 shows a schematic representation of a flow chart which forms the basis for a method for generating signals having adjustable pulse duty factors. In step S1, a setpoint value 10 for a pulse duty factor to be adjusted is initially received. Next, in step S2, a preliminary switching value for the received setpoint value 10 of the pulse duty factor to be adjusted is determined on the basis of a predetermined base value for the maximum count value. In step S3, a preliminary pulse duty factor, which results from the preliminary switching value and the predetermined base value for the maximum count value, is calculated.

Subsequently, in step S4, a deviation of the calculated, preliminary pulse duty factor from the received setpoint value for the pulse duty factor to be adjusted is calculated. By using the ascertained deviation, a maximum count value n_max is then determined in step S5. This maximum count value n_max is obtained by increasing or decreasing the predetermined base value for the maximum count value. Furthermore, the preliminary switching value can also be adapted, if necessary. If an adaptation of the preliminary switching value is not required, the preliminary switching value is utilized as the (final) switching value u.

Subsequently, in order to generate the output signal, in step S6, a counter 12 is initiated with a predefined start value, and the incrementing of the counter 12 at a predetermined clock rate is started. Provided the value n of the counter 12 is less than or equal to the switching value u, a first signal value is output in step S7. If the value n of the counter 12 exceeds the switching value u, a second signal value is output in step S8. If the value of the counter 12 reaches the maximum count value n_max, in step S9, the counter 12 is reset to the predefined start value. The counter 12 then starts to increment again, starting at this start value. Alternatively, the counter can also count backward from the maximum count value n_max until the start value is reached. In this case, when the start value is reached, the counter is reset to the maximum count value. According to one further exemplary embodiment, the counter can also alternatively increment from the start value up to the maximum count value n_max and, when the maximum start value n_max is reached, can count backward down to the start value. When the start value is reached, the counter begins to increment again.

In order to limit the minimum and maximum period of the signal that is generated in this way, the maximum count value n_max can be limited to values within a predetermined value range.

The values for increasing or decreasing the base value for the maximum count value and, if necessary, the preliminary switching value, can be based, in particular, on previously determined values. Alternatively, the values can also be recalculated in each case, in the manner described above.

In summary, the present invention relates to the adjustment of a pulse duty factor of a pulse-width-modulated signal. For this purpose, the period of the pulse-width-modulated signal can be varied. Thus, the pulse duty factor of the pulse-width-modulated signal can be adapted very accurately to the desired pulse duty factor without great switching complexity by using a simple counter having a fixed clock frequency.

The invention claimed is:

1. A device (1) for generating a signal having an adjustable pulse duty factor, comprising:
   a counter (12) which is designed for counting from a predefined start value up to a maximum count value (n_max) at a predetermined clock rate;
   an output device (13) which is designed for outputting a first signal value when the value (n) of the counter (12) is less than or equal to a switching value (u) and outputting a second signal value when the value (n) of the counter (12) is greater than the switching value (u); and
   a control device (11) electrically connected to the counter and to the output device and configured to
   determine a preliminary switching value for a setpoint value (10) of a pulse duty factor to be adjusted, on the basis of a predetermined base value for the maximum count value,
   calculate a preliminary pulse duty factor which results from the preliminary switching value and the base value for the maximum count value,
   ascertain a deviation of the calculated, preliminary pulse duty factor from the setpoint value (10) for the pulse duty factor to be adjusted, and
   increase or decrease the predetermined base value for the maximum count value by using the ascertained deviation, in order to obtain the maximum count value (n_max).

2. The device (1) as claimed in claim 1, wherein the control device (11) adapts the switching value (u) by using the preliminary switching value and the ascertained deviation of the calculated, preliminary pulse duty factor from the setpoint value (10) for the pulse duty factor to be adjusted.

3. The device (1) as claimed in claim 1, wherein the control device (12) further comprises a memory (15) which is designed for providing parameters for increasing or decreasing the base value for the maximum count value and/or adapting the switching value (u).

4. The device (1) as claimed in claim 1, wherein the control device (11) comprises a computing device (16) which is designed for calculating a value for increasing or decreasing the base value for the maximum count value, adapting the switching value (u), or both.

5. A pulse-width-modulation device comprising a device (1) for generating signals as claimed in claim 1.

6. A voltage converter (2) comprising a device (1) for generating signals as claimed in claim 1.

7. A method for generating a signal having an adjustable pulse duty factor, including the steps:

receiving (S1), with a control device, a setpoint value for a pulse duty factor to be adjusted;

determining (S2), with the control device, a preliminary switching value for the received setpoint value of the pulse duty factor to be adjusted, on the basis of a predetermined base value for the maximum count value;

calculating (S3), with the control device, a preliminary pulse duty factor which results from the preliminary switching value and the predetermined base value for the maximum count value;

ascertaining (S4), with the control device, a deviation of the calculated, preliminary pulse duty factor from the received setpoint value for the pulse duty factor to be adjusted;

determining (S5), with the control device, a maximum count value (n_max) by increasing or decreasing the predetermined base value for the maximum count value by using the ascertained deviation;

starting (S6), with the control device, a counter (12) at a predefined start value and incrementing the counter (12) at a predetermined clock rate;

outputting (S7), with an output device, a first signal value when the value (n) of the counter (12) is less than or equal to the switching value (u); and outputting (S8), with the output device, a second signal value when the value (n) of the counter (12) is greater than the switching value (u).

8. The method as claimed in claim 7, having a step (S9) for resetting the counter (12) to the predefined start value when the value of the counter (12) exceeds the maximum count value.

9. The method as claimed in claim 7, wherein the step (S5) for determining the maximum count value (n_max) establishes the maximum count value (n_max) within a predetermined value range.

10. The method as claimed in claim 7, wherein the step (S5) for determining the maximum count value (n_max) adapts a value for increasing or decreasing the predetermined base value by using a predetermined formula.

* * * * *